(12) United States Patent
Knoedgen

(10) Patent No.: US 9,184,742 B2
(45) Date of Patent: Nov. 10, 2015

(54) HIGH SIDE DRIVER WITH POWER SUPPLY FUNCTION

(75) Inventor: Horst Knoedgen, Munich (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 90 days.

(21) Appl. No.: 13/561,338

(22) Filed: Jul. 30, 2012

(65) Prior Publication Data

US 2013/0285710 A1 Oct. 31, 2013

(30) Foreign Application Priority Data

Apr. 30, 2012 (EP) .................................... 12166206

(51) Int. Cl.
*H03K 3/00* (2006.01)
*H03K 17/16* (2006.01)
*H03K 17/687* (2006.01)

(52) U.S. Cl.
CPC .......... *H03K 17/162* (2013.01); *H03K 17/6871* (2013.01); *H03K 2217/0063* (2013.01); *H03K 2217/0081* (2013.01)

(58) Field of Classification Search
USPC ........................................................ 327/108
See application file for complete search history.

(56) References Cited

U.S. PATENT DOCUMENTS

| 6,781,422 B1* | 8/2004 | Yang .............................. 327/108 |
| 7,468,622 B2* | 12/2008 | Bodano et al. ................ 327/390 |
| 2006/0049815 A1* | 3/2006 | Ho et al. ........................ 323/282 |
| 2008/0279026 A1* | 11/2008 | Shiah et al. .................... 365/207 |
| 2010/0123479 A1* | 5/2010 | Osaka ............................. 326/80 |
| 2010/0156359 A1* | 6/2010 | Wardensky .................... 320/167 |

OTHER PUBLICATIONS

European Search Report 12166206.8-1233 Mail date—Feb. 1, 2013, Dialog Semiconductor GmbH.

* cited by examiner

*Primary Examiner* — Lincoln Donovan
*Assistant Examiner* — Patrick Chen
(74) *Attorney, Agent, or Firm* — Saile Ackerman LLC; Stephen B. Ackerman

(57) ABSTRACT

The present document discloses a driver circuit for the high side switch of a half bridge at ultra-high voltage. The half bridge comprises the high side switch coupled to an input voltage Vin and to a midpoint of a low side switch. The driver circuit comprises a control signal generation unit generating a stream of control pulses and a control logic generating a gate voltage for the high side switch using a supply voltage Vcc based on the control pulses, a supply voltage capacitor generating the supply voltage Vcc, and a decoupling capacitor coupled on a first side to the control signal generation unit and on a second side to the control logic, to the midpoint of the half bridge via a first charging switch, and to the supply voltage capacitor via a second charging switch.

14 Claims, 7 Drawing Sheets

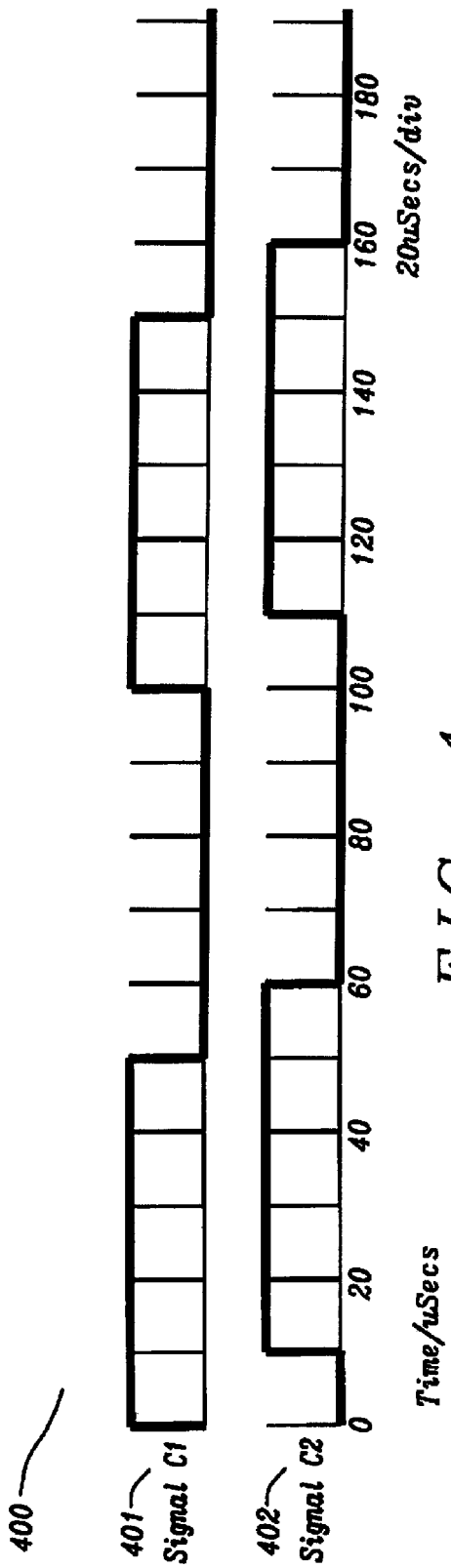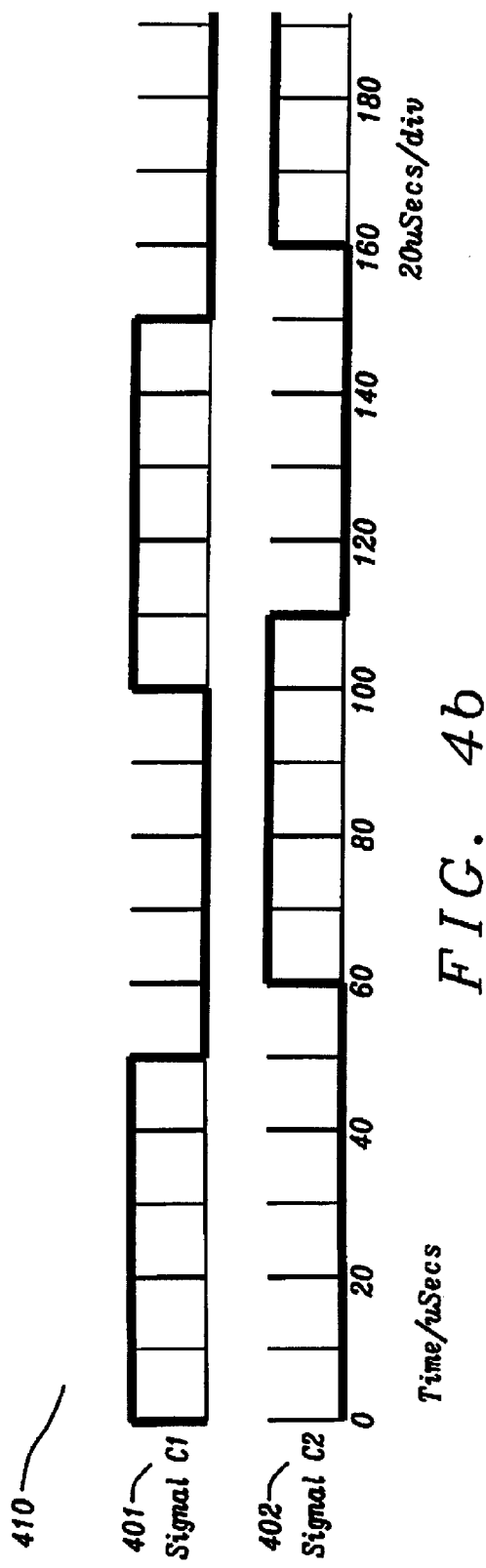

HIGH SIDE DRIVER WITH POWER SUPPLY FUNCTION

TECHNICAL FIELD

The present document relates to a driver for the high side switch of a half bridge. In particular, the present document relates to a method and system for driving the high side switch of a half bridge at ultra-high voltage.

BACKGROUND

Half bridges may be used in power converters (e.g. in resonant power converters). Typical applications for such power converters are driver circuits for solid state lighting (SSL) devices such as Light Emitting Diode (LED) devices or Organic LED (OLED) devices. A half bridge typically comprises a high side switch coupled to an input voltage Vin and a low side switch coupled to ground, wherein the high side switch and the low side switch are switched in an alternating manner between an on-state and an off-state.

A commutation cycle of the half bridge typically comprises a high voltage phase during which the high side switch is in an on-state and during which the low side switch is in an off-state, and a low voltage phase during which the high side switch is in an off-state and during which the low side switch is in an on-state. The commutation cycles may be repeated at a pre-determined commutation cycle rate e.g. in the range of 20 kHz to 10 MHz. The high side and low side switches may be metal oxide semiconductor (MOS) transistors. e.g. PMOS and/or NMOS transistors.

The input voltage Vin of the half bridge may e.g. be derived from the mains power supply. By way of example, the input voltage Vin may be a rectified version of the mains power supply. As such, the input voltage may be a DC voltage at e.g. 400V. The midpoint of the half bridge (i.e. the coupling point between the high side switch and the low side switch) may be coupled via a coupling capacitor to a transformer for galvanic isolation of a subsequent device, e.g. a subsequent SSL device.

The present document describes a driver circuit for the high side switch of a half bridge. In particular, the present document describes a driver circuit for the high side switch of a half bridge, wherein the driver circuit is adapted to generate its supply voltage Vcc (e.g. 12V) directly from the input voltage Vin and at the same time to control the switching instants of the high side switch. As such, a cost effective driver circuit for the high side switch of a half bridge is described.

SUMMARY

A principal object of the present disclosure is to achieve a method and system for a driver circuit of a half bridge circuit having an input voltage Vin up to at least 400V.

A further object of the disclosure is to achieve a driver circuit comprising a control signal generation unit adapted to generate a stream of control pulses.

A further object of the disclosure is to achieve a driver circuit comprising a control logic adapted to generate a gate voltage for the high side switch using a supply voltage Vcc based on the stream of control pulses; wherein the supply voltage Vcc is lower than the input voltage Vin.

A further object of the disclosure is to use a capacitor to generate the supply voltage Vcc.

A further object of the disclosure is that the driver circuit does not require the use of UHV (ultra-high voltage) technology.

According to an aspect a driver circuit for a high side switch of a half bridge is described. The half bridge may comprise the high side switch coupled to an input voltage Vin and coupled at a midpoint to a low side switch, wherein the low side switch is coupled to ground. The input voltage Vin may be a positive voltage or a negative voltage. As such, the function of the high side switch and the low side switch may be inverted. The high side switch and/or the low side switch may be MOS transistors, e.g. NMOS or PMOS transistors. The input voltage Vin may be a DC voltage, e.g. at or above 300 or 400V. The half bridge may be operated at a pre-determined commutation cycle rate with a pre-determined duty cycle. The commutation cycle rate and the duty cycle may be controlled using the driver circuit. It should be noted that the driver circuit is also applicable for a high side switch of a full bridge (e.g. comprising two half bridges).

The driver circuit may comprise a control signal generation unit adapted to generate a stream of control pulses e.g. using a control supply voltage. The control supply voltage is typically lower than the input voltage Vin, e.g. in the range of 12V or lower. In particular, the absolute control supply voltage (i.e. the absolute value of the control supply voltage) may be lower than the absolute input voltage Vin (i.e. the absolute value of the input voltage). The control supply voltage may be non-floating. Furthermore, the driver circuit comprises a control logic adapted to generate a gate voltage for the high side switch based on the stream of control pulses. For generating the gate voltage, the control logic makes use of a supply voltage Vcc. The supply voltage Vcc is typically lower than the input voltage Vin. e.g. in the range of 12V or lower. In particular, the absolute supply voltage Vcc (i.e. the absolute value of the supply voltage) may be lower than the absolute input voltage Vin (i.e. the absolute value of the input voltage). The supply voltage Vcc may be floating. The control logic may comprise logic gates such as inverters, AND gates, NAND gates, etc.

Furthermore, the driver circuit comprises a supply voltage capacitor coupled to the midpoint of the half bridge and adapted to generate or provide the supply voltage Vcc. For this purpose, the supply voltage capacitor may be repeatedly charged along with the commutation cycle of the half bridge. The driver circuit may comprise a Zener diode arranged in parallel to the supply voltage capacitor, wherein the Zener diode has a break down voltage which substantially corresponds to the supply voltage Vcc. By doing this, it can be ensured that the voltage drop across the supply voltage capacitor is limited to the supply voltage Vcc.

The driver circuit may comprise a decoupling capacitor coupled on a first side to the control signal generation unit and coupled on a second side to the control logic. As such, the decoupling capacitor may be used for communication purposes, in order to communicate the stream of control pulses from the control signal generation unit to the control logic, thereby controlling the switching state of the high side switch. Furthermore, the decoupling capacitor may be coupled on the second side to the midpoint of the half bridge via a first charging switch. As such, the decoupling capacitor may be used as a charge reservoir, in order to store energy derived from the input voltage Vin. Furthermore, the decoupling capacitor may be coupled on the second side to the supply voltage capacitor via a second charging switch. As such, the decoupling capacitor may be used to (periodically) recharge the supply voltage capacitor, thereby providing the supply voltage Vcc.

In particular, the first and second charging switches may be controlled such that the decoupling capacitor stores energy drawn from the input voltage Vin and subsequently passes this energy to the supply voltage capacitor, thereby providing the supply voltage Vcc. The first and second charging switches may be diodes or body diodes of transistors.

As such, the first charging switch may be adapted to transfer energy to the decoupling capacitor, e.g. when the midpoint of the half bridge is coupled to the input voltage Vin, and the second charging switch may be adapted to transfer energy from the decoupling capacitor to the supply voltage capacitor, e.g. when the midpoint of the half bridge is coupled to ground, thereby periodically recharging the supply voltage capacitor. Furthermore, the decoupling capacitor may be adapted to transfer the stream of control pulses from the control signal generation unit towards the control logic, thereby enabling the control of the high side switch. As such, a single decoupling capacitor may be used for recharging the supply voltage capacitor and for communicating the stream of control signal. Typically, only the decoupling capacitor may need to be adapted to sustain the input voltage Vin, i.e. the driver circuit may only require a single capacitor which is capable of sustaining the (relatively high) input voltage Vin.

The driver circuit may comprise current sensing means adapted to sense a current between the control signal generation unit and the decoupling capacitor. The current may be indicative of a transition from a high voltage state of the half bridge, where the midpoint is coupled to the input voltage Vin, to a low voltage state of the half bridge, where the midpoint is coupled to ground, and/or vice versa. The current sensing means may comprise a current sensing resistor arranged in series with the decoupling capacitor and/or an operational amplifier adapted to amplify a voltage drop across the current sensing resistor. As such, a peak in the current at the decoupling capacitor can be measured as a voltage peak at the output of the operational amplifier.

The control signal generation unit may comprise a high side control switch adapted to couple an output of the control signal generation unit to the control supply voltage. Furthermore, the control signal generation unit may comprise a low side control switch adapted to couple an output of the control signal generation unit to ground. As such, the control signal generation unit may comprise a control half bridge which may be used to generate the stream of control pulses using the control supply voltage.

The control signal generation unit may comprise a control supply voltage capacitor adapted to provide the control supply voltage. The control supply voltage capacitor may be coupled to the high side control switch and the high side control switch may be configured to couple/decouple a midpoint of the control half bridge to the control supply voltage capacitor. Furthermore, the control supply voltage capacitor may be coupled to ground. The midpoint of the control half bridge may be coupled to the decoupling capacitor. The high side control switch may be adapted to charge the control supply voltage capacitor using energy stored in the decoupling capacitor. In particular, the high side control switch may be adapted to control a voltage drop across the control supply voltage capacitor, thereby controlling the control supply voltage. As such, the provisioning of the control supply voltage may be independent of the switching state of the high side switch. In particular, the control supply voltage may be provided even at extended on/off states of the high side switch (thereby making the driver circuit applicable to half bridges/full bridges which are operated at low commutation cycle rates).

The control signal generation unit may be adapted to vary a width of the pulses of the stream of control pulses. The width of the pulses may be used as an indication to the control logic regarding the switching state (i.e. the on/off state) of the high side switch. In particular, the driver circuit may comprise a filter unit (e.g. comprising an RC circuit) arranged between the second side of the decoupling capacitor and the control logic. The filter unit may be adapted to low-pass filter the stream of control pulses, thereby generating a control signal for the control logic (e.g. a low voltage signal and/or a high voltage signal depending on the width of the pulses).

The driver circuit may comprise a second control signal generation unit adapted to generate a second stream of control pulses using the control supply voltage or a second control supply voltage. The second control supply voltage may be non-floating. Furthermore, the driver circuit may comprise a second decoupling capacitor coupled on a first side to the second control signal generation unit and coupled on a second side to the control logic, the midpoint of the half bridge via a third charging switch, and the supply voltage capacitor via a fourth charging switch. The third and fourth charging switches may be configured in a similar manner to the first and second charging switches.

The control logic may be adapted to generate the gate voltage for the high side switch based on the stream of control pulses and based on the second stream of control pulses. In particular, the control logic may be adapted to detect an in-phase and/or an out-of-phase behavior of the stream of control pulses with respect to the second stream of control pulses. The in-phase and/or an out-of-phase behavior may be used to control an on-state and/or an off-state of the high side switch. The stream of control pulses may be considered to be in-phase with respect to the second stream of control pulses if the phase offset lies below a predetermined first phase threshold. The stream of control pulses may be considered to be out-of-phase with respect to the second stream of control pulses if the phase offset lies above a pre-determined second phase threshold (which is typically equal to or greater than the first phase threshold). As such, the control logic may be adapted to determine the phase offset of the stream of control pulses with respect to the second stream of control pulses. The determined phase offset may also be used to determine a dead time between the on-state of the high side switch and an on-state of the low side switch and/or vice versa.

In accordance with the objects of this disclosure a driver circuit for a high side switch of a half bridge, wherein the half bridge comprises the high side switch coupled to an input voltage Vin and coupled at a midpoint to a low side switch, and wherein the low side switch is coupled to ground, has been achieved. The driver circuit comprises a control signal generation unit adapted to generate a stream of control pulses, a control logic adapted to generate a gate voltage for the high side switch using a supply voltage Vcc based on the stream of control pulses; wherein the absolute supply voltage Vcc is lower than the absolute input voltage Vin, a supply voltage capacitor coupled to the midpoint of the half bridge and adapted to generate the supply voltage Vcc, and a decoupling capacitor coupled on a first side to the control signal generation unit and coupled on a second side to the control logic, to the midpoint of the half bridge via a first charging switch, and to the supply voltage capacitor via a second charging switch.

In accordance with the objects of this disclosure a method for a driver of a half bridge circuit having an input voltage Vin up to at least 400V has been achieved. The method comprises the following steps of: (1) providing a driver circuit for a half-bridge comprising a high side switch and a low side bridge having an input voltage Vin up to at least 400V comprising a control signal generation unit, (2) operating the half bridge at a commutation cycle and with a duty cycle which are controlled by the driver circuit, and (3) generating a gate voltage for the high side switch by a control logic using a supply voltage Vcc which is based on the stream of control pulses wherein the absolute value of the supply voltage Vcc is smaller than the absolute value of the input voltage Vin.

It should be noted that the methods and systems including its preferred embodiments as outlined in the present document may be used stand-alone or in combination with the other methods and systems disclosed in this document. Furthermore, all aspects of the methods and systems outlined in the present document may be arbitrarily combined. In particular, the features of the claims may be combined with one another in an arbitrary manner.

BRIEF DESCRIPTION OF THE DRAWINGS

In the accompanying drawings forming a material part of this description, there is shown:

FIG. 2b illustrates example voltage values for the circuit diagram of FIG. 2a.

FIGS. 4a and 4b show example control signals for controlling the switching of the high side switch using the driver circuit of FIG. 3.

DETAILED DESCRIPTION

Figure 1:
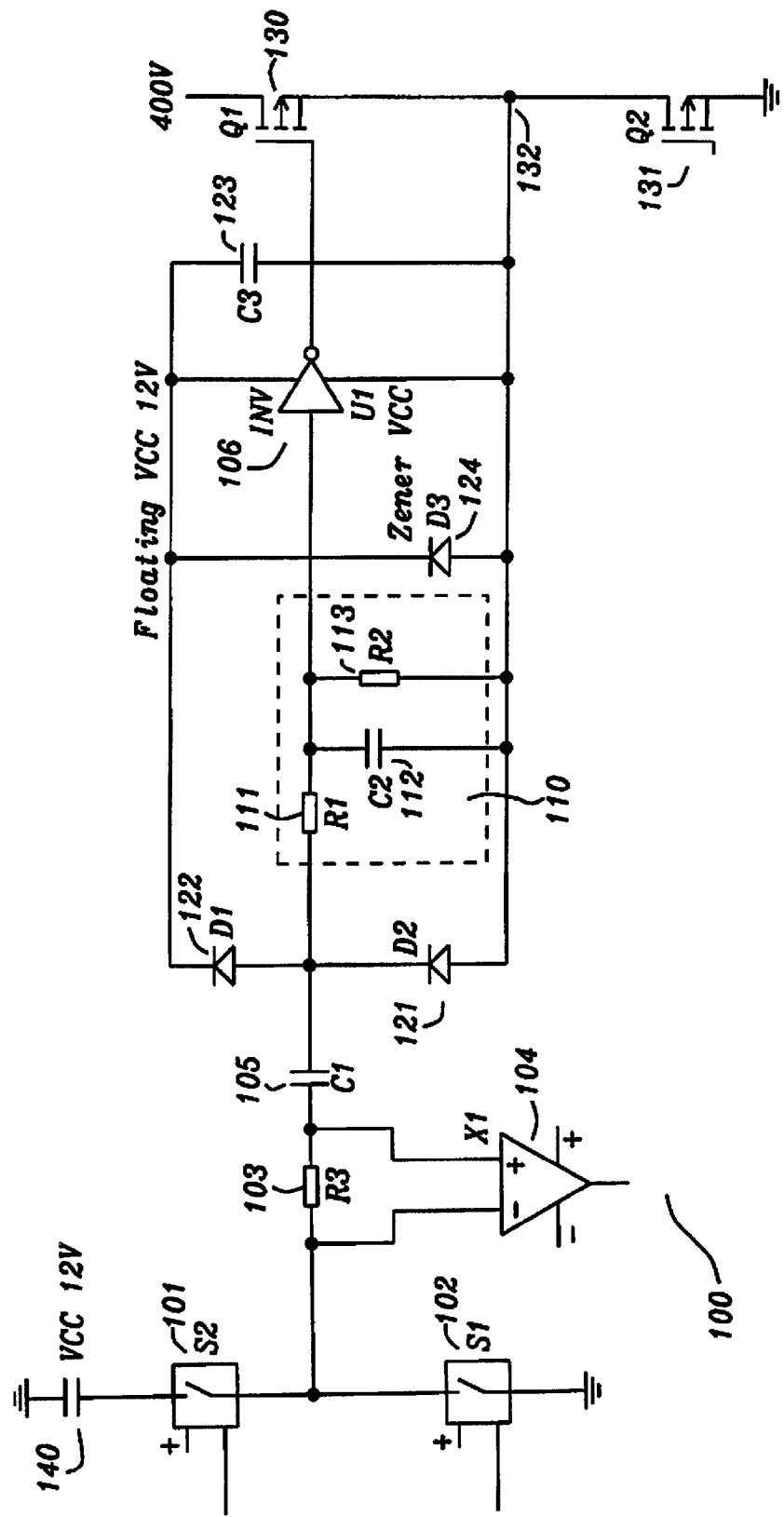
FIG. 1 illustrates a circuit diagram of an example driver circuit for the high side switch of a half bridge.

FIG. 1 illustrates the circuit diagram of an example driver circuit 100 of a half bridge. The half bridge comprises a high side switch Q1 130 and a low side switch Q2 131 which may be MOS transistors, e.g. PMOS transistors. The driver circuit 100 comprises two control switches S1 102 and S2 101 forming a control half bridge. The high side control switch S2 101 is coupled to the supply voltage Vcc of the driver circuit (e.g. Vcc=12V) and the low side control switch S1 102 is coupled to ground. The control switches S2 101 and S1 102 may be used to generate control pulses with different width for controlling the state (on-state or off-state) of the high side switch 130. In particular, the control switches 101, 102 may be used to generate a stream of control pulses.

As such, the control half bridge comprising the control switches 101, 102 may be operated by repeating a control commutation cycle comprising a first phase where the high side control switch 101 is in the on-state and the low side control switch 102 is in the off-state, and a second phase where the high side control switch 101 is in the off-state and the low side control switch 102 is in the on-state. The control commutation cycle may be repeated at a control commutation cycle rate.

Furthermore, the length of the first phase with respect to the length of the control commutation cycle, referred to as the duty cycle, may be varied. By varying the duty cycle of the control half bridge, the width of the control pulses may be varied. As such, the control half bridge may generate a stream of control pulses at a control commutation rate, wherein the width of the control pulses depends on the duty cycle of the control half bridge.

The stream of control pulses is passed via a decoupling capacitor C1 105 to a filter circuit 110. The example filter circuit 110 comprises resistors R1 111 and R2 113, as well as a capacitor C2 112, i.e. the example filter circuit 110 comprises an RC circuit. As such, the filter circuit 110 forms a low pass filter for the stream of control pulses. The output of the filter circuit 110 is a filtered stream of control pulses, also referred to herein as the control signal. Due to the low pass filtering, the control signal is a (substantially) constant signal at a (substantially) constant control voltage level. The control voltage level depends on the duty cycle of the control half bridge, i.e. on the width of the control pulses in the stream of control pulses. In case of a high duty cycle (e.g. a duty cycle of 90% or greater), the control signal is at a high voltage level (e.g. in the range of the supply voltage Vcc). On the other hand, in case of a low duty cycle (e.g. a duty cycle of 10% or less), the control signal is at a low voltage level (e.g. in the range of 0V). The control signal may be used by control logic U1 106 to set the gate voltage of the high side switch 130. In the illustrated example, a control signal at a high voltage level triggers the control logic 106 to generate a low gate voltage to the high side switch 130, thereby switching the high side switch 130 to the off-state. On the other hand, a control signal at a low voltage level triggers the control logic 106 to generate a high gate voltage to the high side switch 130, thereby switching the high side switch 130 to the on-state. In the illustrated example, the control logic 106 is an inverter.

The supply voltage Vcc can be generated within the driver circuit 100 using the supply voltage capacitor 123 and the diodes D1, D2, 122, 121. This supply voltage Vcc may e.g. be used to supply power to the control logic 106. The supply voltage capacitor 123 may be repeatedly recharged in accordance to the commutation cycle of the half bridge comprising the switches 130, 131. During the high voltage phase of the half bridge, the midpoint 132 between the high side switch 130 and the low side switch 131 is at the input voltage Vin (e.g. Vin=400V). This leads to a charging of the decoupling capacitor C1 105 via the diode D2 121. In particular, this leads to a current peak at the decoupling capacitor C1 105 during the transition from the low voltage phase to the high voltage phase. Hence, the decoupling capacitor C1 105 is charged at the transition from the low voltage phase to the high voltage phase.

Upon commutation of the half bridge from the high voltage phase to the low voltage phase, the midpoint 132 of the half bridge moves to ground. The decoupling capacitor C1 105 may be discharged via the diode D1 122, thereby charging the supply voltage capacitor 123. The discharging of the decoupling capacitor C1 105 typically occurs during the transition from the high voltage phase to the low voltage phase. A Zener diode D3 124 arranged in parallel to the supply voltage capacitor 123 may be used to set the supply voltage Vcc. In particular, a Zener diode 124 having a break down voltage which corresponds to the supply voltage Vcc may be used, thereby ensuring that the voltage drop across the supply voltage capacitor 123 is limited to the supply voltage Vcc. As such, the transition between the high voltage phase and the low voltage phase of the half bridge may be used to recharge the supply voltage capacitor 123, thereby inherently providing a supply voltage Vcc without the need for an extra power converter.

The driver circuit 100 further comprises a current sensing resistor R3 103 and a differential amplifier X1 104 which have the function of current sensing means. The current sensing means sense the current through the decoupling capacitor C1 105 in order to detect the time instant of the transition from the high voltage state to the low voltage state of the half bridge (and vice versa). This time instant may be detected based on a peak of the sensed current. The detected time instant may be used to compensate for a delay within the control path from the control half bridge (comprising the switches 101, 102) to the control logic 106. Typically, there is a delay between the time instant when the duty cycle of the control half bridge is modified (e.g. from 10% to 90% or vice versa) and the time instant when the high side switch 130 switches (e.g. from on-state to off-state or vice versa). This delay can be captured using the current sensing means 103, 104 and can be taken into account for timing calibration. This delay is typically due to the filter circuit 110. The captured delay may be used to determine an appropriate time instant for modifying the duty cycle of the control half bridge.

Overall, the driver circuit 100 of FIG. 1 is configured to generate the supply voltage Vcc and to control the high side switch 130 in a compact manner. A decoupling capacitor C1 105 is used to decouple the control signals generated by the control half bridge from the input voltage. Furthermore, the decoupling capacitor C1 105 is used as a charge source for charging the supply voltage capacitor C3 123 which acts as a charge pump for the supply voltage Vcc.

In other words, the diodes D1 122 and D2 121 may be used for charging the (floating) supply voltage capacitor C3 123, thereby providing a floating supply voltage Vcc. By means of the PWM (pulse width modulation) provided by the control half bridge, the output voltage of the filter circuit 110, i.e. the control signal, can be controlled to lie within a range of nearly zero Volt up to the supply voltage Vcc floating, thereby controlling the high side switch 130. During switching of the half bridge, the charge of the decoupling capacitor C1 105 may be used for the power supply of Vcc (ground related) by using the switches S1 102 and S2 101. In other words, the half bridge may be used to recharge the (non-floating) supply voltage (Vcc) capacitor 140 for the control half bridge comprising the switches S1 102 and S2 101. The charge of the decoupling capacitor C1 105 may be used to recharge the (non-floating) supply voltage capacitor 140. The switches S1 102 and S2 101 may be used to maintain the voltage drop across the (non-floating) supply voltage capacitor 140 at the desired supply voltage Vcc (e.g. 12V).

With the current sensing means 103, 104, the actual switching of the half bridge can be measured and the delay of the filter 110 in the control path of the high side switch 130 can be compensated. The compensation may be achieved by adjusting the time instant when the duty cycle of the control half bridge is changed.

Figure 2A:
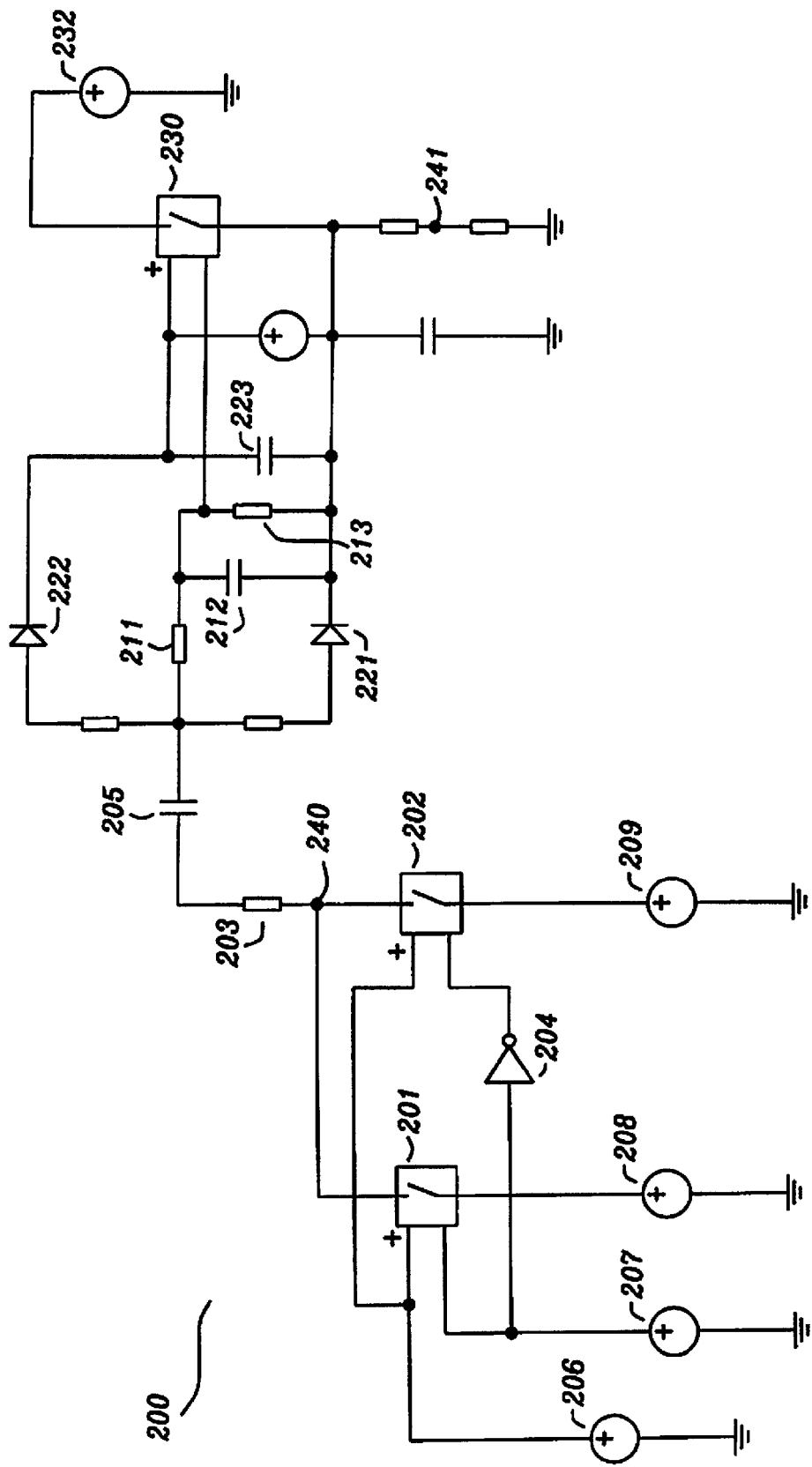
FIG. 2a shows a circuit diagram of another example driver circuit for the high side switch of a half bridge.

FIG. 2a illustrates a circuit diagram of another driver circuit 200 for a high side switch. In the circuit diagram of FIG. 2a, input voltage Vin is provided by power supply 232 and the high side switch is represented by switch 230. In a similar manner to the driver circuit 100, the driver circuit 200 comprises means for generating a stream of control pulses. The means for generating a stream of control pulses at the node 240 comprises various power supplies 206, 207, 208, 209 which are used to control switches 201 and 202. The stream of control pulses passes a decoupling capacitor 205 and a filter comprising resistors 211, 213 and a capacitor 212, in order to generate a control signal for the switch 230 as the output voltage of the filter. The width of the pulses of the stream of control pulses may be used to control the output voltage of the filter (i.e. to set the control signal), and to thereby control the switch 230.

At the same time, the charge of the decoupling capacitor 205 (which is build up by the voltage supply 232 when the switch 230 is closed) may be used to repeatedly charge supply voltage capacitor 223 using diodes 221 and 222.

In the illustrated example, the switch 230 is a Schmitt trigger. The switch 230 is controlled via the different width of the pulses of the stream of control pulses. The delay in the control path which is caused by the RC filter (comprising the resistors 211, 213 and the capacitor 212) may be measured by current sensing means (e.g. at the resistor 203) and may be compensated. Typically a high current through the resistor 203 is generated, when the switch 230 (i.e. the high side switch of the half bridge) is switched to its on-state, i.e. when the half bridge swings towards the high voltage state.

In contrast to the use of high voltage integrated circuit (IC) driver circuits or in contrast to the use of transformers, the driver circuit 200 is beneficial as it only makes use of a single high voltage (decoupling) capacitor 205 which is used for the communication of the control signals and for the recharging of the supply voltage Vcc (using the supply voltage capacitor 223). As such, the driver circuit 200 is cost efficient compared to other high side switch driver solutions.

Figure 2B:
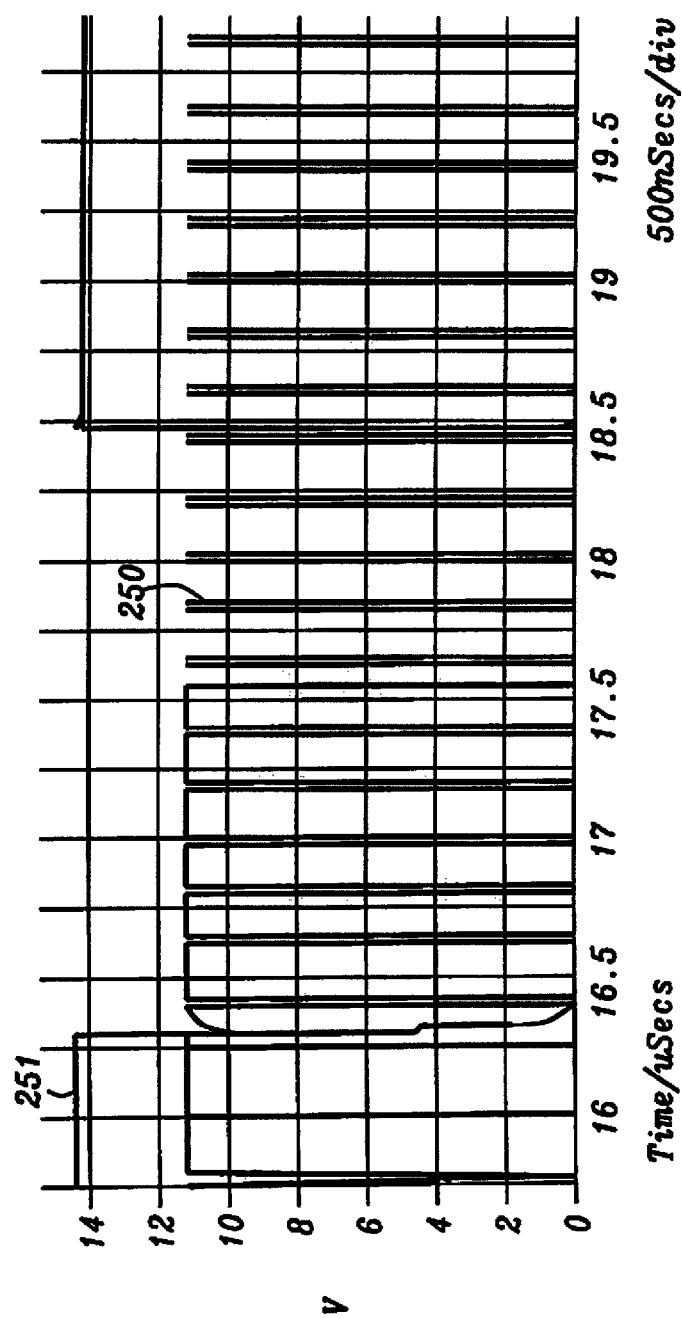

FIG. 2b shows the voltage 251 at the (simulated) midpoint 241 of the half bridge comprising the (high side) switch 230. It can be seen how the voltage 251 moves to a high state or to a low state as a function of the pulse width of the stream of control pulses 250. In particular, it can be seen that by reducing the width of the control pulses 250, the (high side) switch 230 may be triggered to switch to the on-state, thereby moving the voltage 251 to the high state. It can also be seen that there is a delay between the modification of the width of the control pulses 250 and the reaction of the half bridge. This delay is mainly due to the RC filter (comprising the resistors 211, 213 and the capacitor 212).

Figure 3:
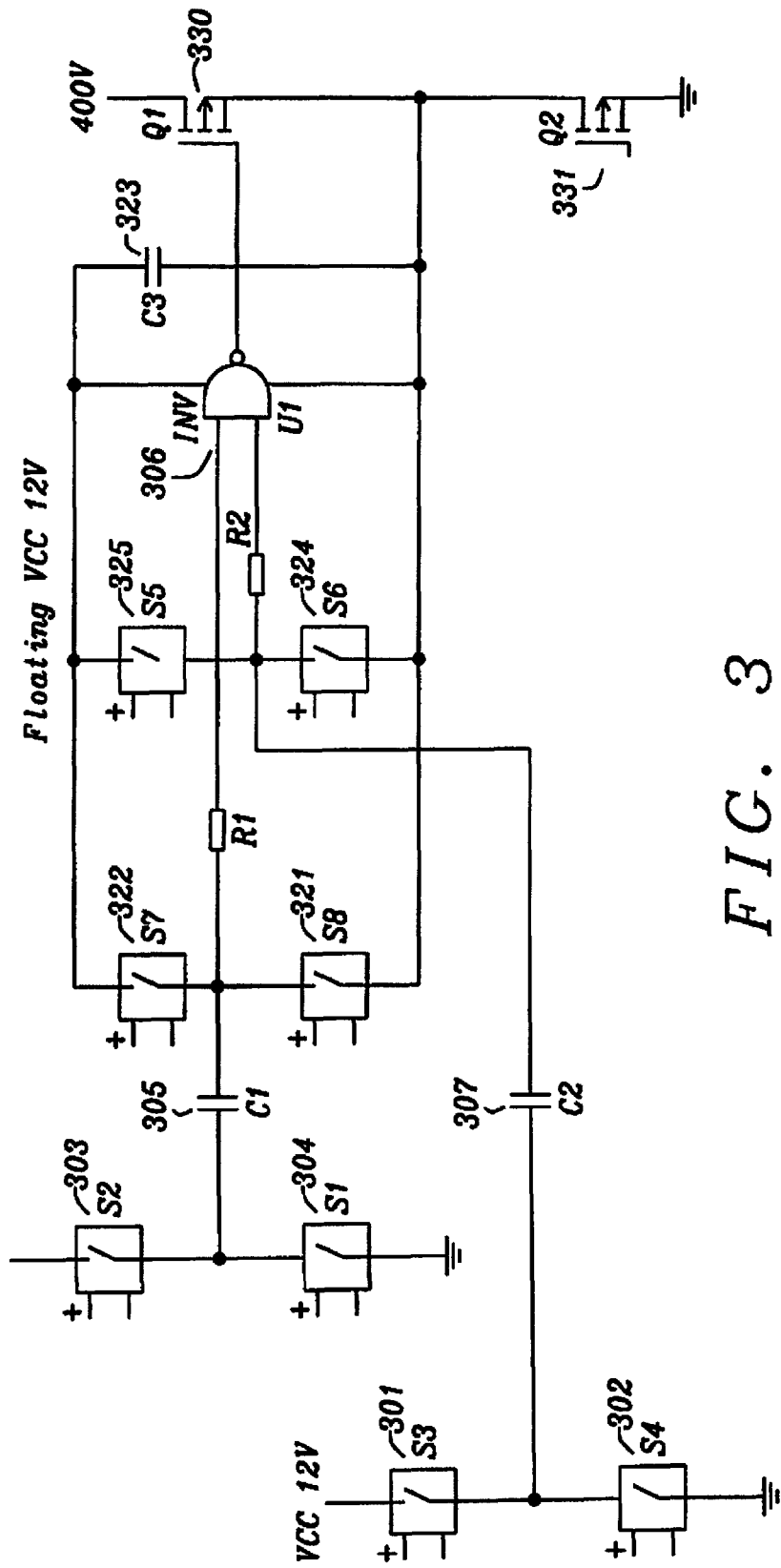
FIG. 3 shows a circuit diagram of another example driver circuit for the high side switch of a half bridge.

FIG. 3 shows a circuit diagram of another driver circuit 300 for a high side switch 330. The circuit diagram shows a half bridge comprising a high side switch 330 and a low side switch 331. The driver circuit 300 comprises control components for controlling the state of the high side switch and supply voltage components for generating the supply voltage Vcc of the driver circuit 300 from the input voltage Vin, e.g. Vin=400V, of the half bridge. The control components comprise a first pair of control switches S2 303, S1 304 for generating a first stream of control pulses. The first stream of control pulses is passed to control logic 306 via the first decoupling capacitor C1 305. The control logic 306 analyzes the first stream of control pulses, and generates a gate voltage for the high side switch 330 based on the first stream of control pulses. In the illustrated example, the driver circuit comprises a second pair of control switches S3 301, S4 302 for generating a second stream of control pulses which is passed to the control logic 306 via the second decoupling capacitor C2 307. The control logic 306 is configured to generate the gate voltage for the high side switch 330 also based on the second stream of control pulses.

FIGS. 4a and 4b show a first stream of contra pulses 401 and a second stream of control pulses 402, which may be passed to the control logic 306 for generating the gate voltage. In the diagram 400 the first and second streams 401, 402 are (substantially) in-phase, whereas in the diagram 410 the first and second streams 401, 402 are (substantially) out-of-phase. The in-phase/out-of-phase information may be interpreted by the control logic 306 to generate a high/low gate voltage for the high side switch 330, thereby controlling the switching state of the high side switch 330. Furthermore, the offset between the first and second streams 401, 402 may be used for timing information, e.g. to control a death time between an on-state of the high side switch 330 and an on-state of the low side switch 331 (and/or vice versa). The death time may be the time during which the low side switch 331 and the high side switch 330 are open at the same time. In other words, the phase between the edges of the streams 401, 402 may be used to carry timing information (e.g. to control the death time during which the high side switch 330 will remain in the current state).

Referring again to FIG. 3, the supply voltage components of the driver circuit 300 comprise a supply voltage capacitor 323, a first pair of charging switches S8 321, S7 322 and a second pair of charging switches S6 324, S5 325. During the on-state of the high side switch Q1 330, the lower charging switches S8 321, S6 324 are closed and the upper charging switches 322, 325 are opened to charge the first and second decoupling capacitors 305, 307. Upon switching from the high voltage state of the half bridge to the low voltage state (i.e. when the high side switch 330 goes to off-state and the low side switch Q2 331 goes to on-state), the lower charging switches 321, 324 are opened and the upper charging switches 322, 325 are closed to allow the first and second decoupling capacitors 305, 307 to charge the supply voltage capacitor C3 323, thereby re-generating the supply voltage Vcc. As illustrated in FIGS. 1 and 2a, the charging switches 321, 322, 324, 325 may be implemented as diodes and/or as body diodes of a transistor.

For start-up of the driver circuit, the supply voltage Vcc (e.g. Vcc=12 V) may be generated from the input voltage Vin (e.g. Vin=400 V) using a start-up resistor or a switch. During operation, the control switches S1 to S4 (reference numerals 301 to 304) may be used as a low current capacitive charge pump. In other words, the control switches S1 to S4 of the control half bridges may be used to control the charging of (non-floating) supply voltage capacitors which couple the switches S2 303 and S3 301 to ground, respectively (similar to the non-floating supply voltage capacitor 140 in FIG. 1). The charge of these (non-floating) supply voltage capacitors provides the supply voltage Vcc (e.g. 12V) to the control half bridges, respectively. The re-charging of the (non-floating) supply voltage capacitors may be controlled by the control switches S1 to S4. In particular, the voltage drop across the (non-floating) supply voltage capacitors may be controlled by the control switches S1 to S4, thereby providing a (constant) (non-floating) supply voltage Vcc to the control half bridges. The charge for recharging the (non-floating) supply voltage capacitors may be provided by the coupling capacitors 305, 307, respectively. This means that the charge pump can act without switching of the half bridge (comprising the high side switch 330 and the low side switch 331). In particular, this means that the driver circuit 100, 300 is able to recharge the (non-floating) supply voltage capacitors from ground (using the coupling capacitors 305, 207), i.e. the high side switch 330 may be maintained in an on-state/off-state for prolonged periods of time. As such, the driver circuit 100, 300 is applicable to half-bridges and/or full-bridges which are operated at relatively low commutation rates (e.g. 10 Hz to 100 Hz) with prolonged on/off-states of the high side switch 330.

When the low side switch 331 of the half bridge is closed and grounds the floating part of the driver circuit 300, the (floating) supply voltage capacitor C3 323 will be charged to the supply voltage Vcc (e.g. Vcc=12 V). The charging switches S6 to S9 (reference numerals 321, 322, 324, 325) are used as diodes and the (floating) supply voltage capacitor C3 323 stores energy. As shown in FIGS. 4a and 4b, the relative phases of the streams of control pulses 401, 402, which are transmitted via the decoupling capacitors C1 305 and C2 307, respectively, may be used by the control logic 306 to generate the switch off/on signal for the high side switch 330. By way of example, the control logic 306 may interpret a phase mismatch below a first phase threshold as an instruction to put the high side switch 330 in the off-state and a phase mismatch above a second phase threshold (typically higher than the first phase threshold) as an instruction to put the high side switch 330 in the on-state. For this purpose, the control logic 306 may make use of logic gates such as NAND gates etc. Typically, the control logic 306 comprises various components (represented by the NAND gate in FIG. 3).

As already discussed above, the coupling capacitors C1 305, C2 307 may be used to re-charge (non-floating) supply voltage capacitors for the control half bridges. The control switches S2 303 and S3 301, as well as the charging switches S8 321 and S6 324 may be closed. When the floating part of the driver circuit 300 swings to the input voltage Vin (e.g. Vin=400 V), the charging capacitors C1 305 and C2 307 provide energy to the (non-floating) supply voltage capacitors of the control half bridges and the (non-floating) supply voltage Vcc (e.g. Vcc=12 V) will be charged. The control signal across the coupling capacitors C1 305 and C2 307 may be used to force to switch on the high side switch with a delay. For switching down a similar procedure may be applied using the opposite control signals.

The control switches S2 303, S1 304, S3 301, and S4 302 may be used to control the voltage drop across the (non-floating) supply voltage capacitors, thereby controlling the supply voltage Vcc. Once the charge of the (non-floating) supply voltage capacitors is sufficient to supply Vcc, the switches S2 303, S1 304, S3 301, S4 302 may be used toggle round the coupling capacitors C1 305, C2 307 during the 400 V swing.

It should be noted that during the transition from the high voltage state of the half bridge to the low voltage state (and/or vice versa), the decoupling capacitors 305, 307 are typically not able to transmit the control signals generated by the control switches 301, 302, 303, and 304. As such, the decoupling capacitors 305, 307 alternate between a charging function (for charging the supply voltage capacitor 323) and a communication function (for communicating the streams of control pulses to the control logic 306).

Figure 6:
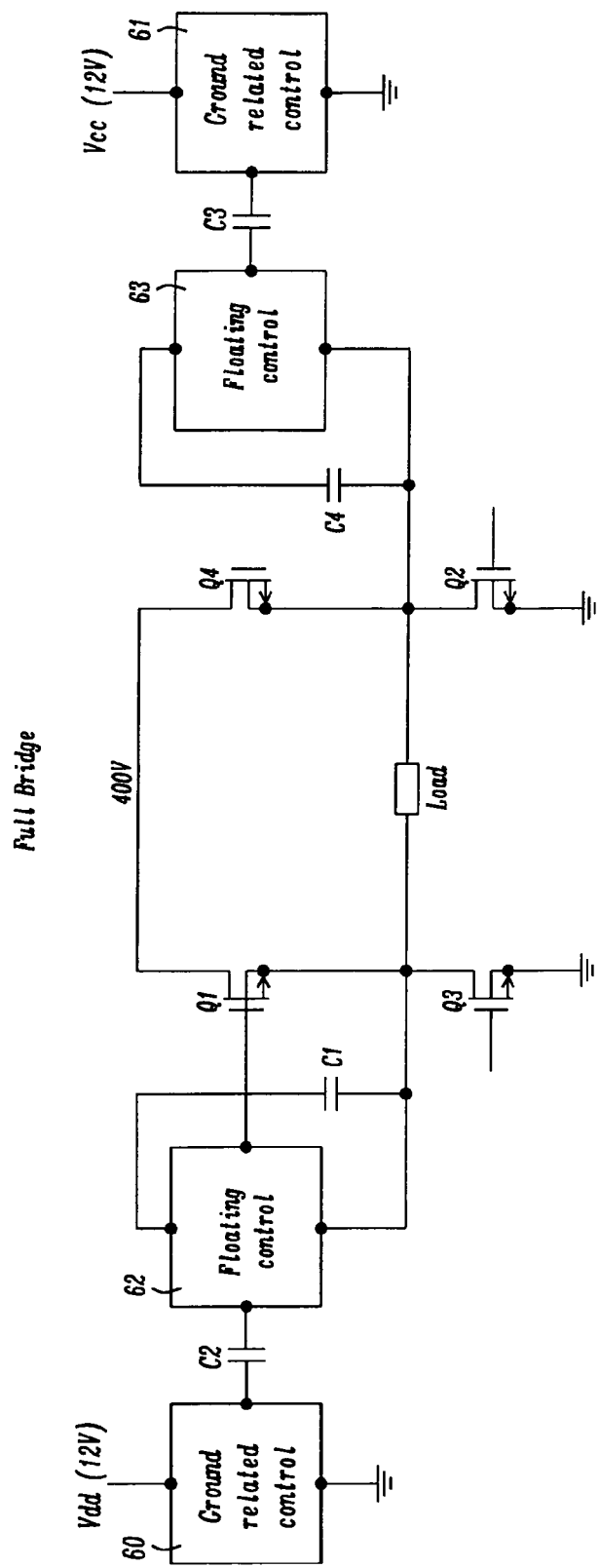
FIG. 6 shows an arrangement of a full bridge, which is a combination of two half bridges.

FIG. 6 shows an arrangement of a full bridge, which is a combination of two half bridges. The full bridge is a combination of two half bridges as described above. In FIGS. 6, Q1 and Q3 form the first half bridge and Q4 and Q2 form the second half bridge. The first and second half bridges form the total full bridge. Furthermore, FIG. 6 shows the driver circuit components for each one of the two half bridges, i.e. control signal generation units for each of the half bridges, referred to as ground related control 60 and 61, control logic units for each of the half bridges, referred to as floating control 62 and 63, supply voltage capacitors C1 and C4, respectively, and decoupling capacitors C2 and C3, respectively. Hence, the control circuit for the full bridge comprises the components of the driver circuit for the first and the second half bridge, respectively as described above for a half bridge.

Figure 5:
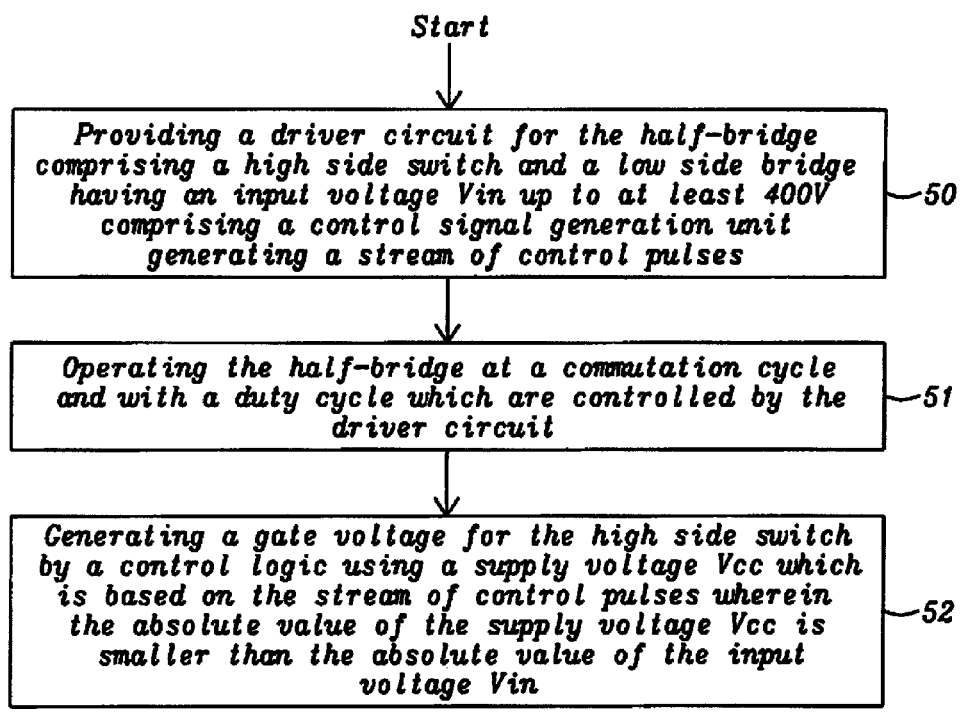
FIG. 5 illustrates a flowchart of a method for a driver of a half bridge circuit having an input voltage Vin up to at least 400V.

FIG. 5 illustrates a flowchart of a method for a driver of a half bridge circuit having an input voltage Vin up to at least 400V.

Step 50 of the method of FIG. 5 illustrates the provision of a driver circuit for a half-bridge comprising a high side switch and a low side bridge having an input voltage Vin up to at least 400V comprising a control signal generation unit generating a stream of control pulses. As mentioned above the method is also applicable for a high side switch of a full bridge (e.g. comprising two half bridges). Step 51 depicts operating the half bridge at a commutation cycle and with a duty cycle which are controlled by the driver circuit. Step 52 shows generating a gate voltage for the high side switch by a control logic using a supply voltage Vcc which is based on the stream of control pulses wherein the absolute value of the supply voltage Vcc is smaller than the absolute value of the input voltage Vin.

In the present document, driver circuits and methods therefore for high side switches of a half bridge have been described. The driver circuits make use of one or more (high voltage) decoupling capacitors which are used for re-charging the power supply of the supply voltage Vcc of the driver circuit and at the same time for communicating the control signals to the control logic of the driver circuit. As such, the driver circuit can be implemented in an efficient manner. In particular, the driver circuit does not require the use of UHV (ultra-high voltage) technology, and no additional high voltage elements (except for the decoupling capacitors) are required.

In the present document, the term "couple" or "coupled" refers to elements being in electrical communication with each other, whether directly connected e.g., via wires, or in some other manner.

It should be noted that the description and drawings merely illustrate the principles of the proposed methods and systems. Those skilled in the art will be able to implement various arrangements that, although not explicitly described or shown herein, embody the principles of the disclosure and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. A driver circuit for a high side switch of a half bridge, wherein the half bridge comprises the high side switch coupled to an input voltage Vin and coupled at a midpoint to a low side switch, wherein the low side switch is coupled to ground, the driver circuit comprising:
   a control signal generation unit adapted to generate a stream of control pulses; wherein the control signal generation unit comprises
      a high side control switch adapted to couple an output of the control signal generation unit to a non-floating control supply voltage; and
      a control supply voltage capacitor coupled to ground and adapted to provide the non-floating control supply voltage;
   a control logic adapted to generate a gate voltage for the high side switch using a floating supply voltage Vcc based on the stream of control pulses; wherein the absolute supply voltage Vcc is lower than the absolute input voltage Vin;
   a supply voltage capacitor coupled to the midpoint of the half bridge and adapted to generate the floating supply voltage Vcc; and
   a decoupling capacitor coupled on a first side to the control signal generation unit and coupled on a second side to the control logic;
      the midpoint of the half bridge via a first charging switch; and
      the supply voltage capacitor via a second charging switch;
   wherein the driver circuit is configured to generate the floating supply voltage Vcc from the input voltage Vin and wherein the driver circuit is configured to control the first and second charging switches such that, repeatedly with a commutation cycle of the half bridge, the decoupling capacitor stores energy drawn from the input voltage Vin, when the midpoint of the half bridge is coupled to the input voltage Vin, and subsequently passes the energy to the supply voltage capacitor, when the midpoint of the half bridge is coupled to ground, thereby providing the floating supply voltage Vcc; and wherein the high side control switch is adapted to charge the control supply voltage capacitor using energy stored in the decoupling capacitor.

2. The driver circuit of claim 1, wherein
   the decoupling capacitor is adapted to transfer the stream of control pulses from the control signal generation unit towards the control logic.

3. The driver circuit of claim 1, further comprising
   a Zener diode arranged in parallel to the supply voltage capacitor; wherein the Zener diode has a break down voltage which substantially corresponds to the supply voltage Vcc.

4. The driver circuit of claim 1, further comprising
   current sensing means adapted to sense a current between the control signal generation unit and the decoupling capacitor; wherein the current is indicative of a transition from a high voltage state of the half bridge where the midpoint is coupled to the input voltage Vin, to a low voltage state of the half bridge where the midpoint is coupled to ground, or vice versa.

5. The driver circuit of claim 4, wherein the current sensing means comprise
   a current sensing resistor arranged in series with the decoupling capacitor; and
   an operational amplifier adapted to amplify a voltage drop across the current sensing resistor.

6. The driver circuit of claim 1, wherein the control signal generation unit comprises
   a low side control switch adapted to couple the output of the control signal generation unit to ground; wherein the control signal generation unit is adapted to generate the stream of control pulses using the control supply voltage; wherein the control supply voltage is lower than the input voltage Vin.

7. The driver circuit of claim 1, wherein the control signal generation unit is adapted to vary a width of the pulses of the stream of control pulses.

8. The driver circuit of claim 7, further comprising a filter unit arranged between the second side of the decoupling capacitor and the control logic, and adapted to low-pass filter the stream of control pulses, thereby generating a control signal for the control logic.

9. The driver circuit of claim 8, wherein the filter unit comprises an RC circuit.

10. The driver circuit of claim 1, wherein the first and second charging switches are diodes.

11. The driver circuit of claim 1, further comprising a. a second control signal generation unit adapted to generate a second stream of control pulses using a second control supply voltage; b. a second decoupling capacitor coupled on a first side to the second control signal generation unit and coupled on a second side to i. the control logic; ii. the midpoint of the half bridge via a third charging switch; and iii. the supply voltage capacitor via a fourth charging switch.

12. The driver circuit of claim 11, wherein the control logic is adapted to generate the gate voltage for the high side switch based on the stream of control pulses and based on the second stream of control pulses.

13. The driver circuit of claim 12, wherein the control logic is adapted to a. detect an in-phase and/or an out-of-phase behavior of the stream of control pulses with respect to the second stream of control pulses; and b. determine a phase offset of the stream of control pulses with respect to the second stream of control pulses.

14. The driver circuit of claim 13, wherein a. the in-phase and/or an out-of-phase behavior is used to control an on-state and/or an off-state of the high side switch; and b. the phase offset is used to determine a dead time between the on-state of the high side switch and an on-state of the low side switch and/or vice versa.

* * * * *